United States Patent
Inaba

(10) Patent No.: US 7,259,428 B2
(45) Date of Patent: Aug. 21, 2007

(54) SEMICONDUCTOR DEVICE USING SOI STRUCTURE HAVING A TRIPLE-WELL REGION

(75) Inventor: Satoshi Inaba, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

(21) Appl. No.: 11/097,387

(22) Filed: Apr. 4, 2005

(65) Prior Publication Data

US 2006/0027877 A1    Feb. 9, 2006

(30) Foreign Application Priority Data

Aug. 5, 2004    (JP)    ............... 2004-229536

(51) Int. Cl.
- H01L 27/01 (2006.01)
- H01L 27/12 (2006.01)
- H01L 31/0392 (2006.01)
- H01L 29/00 (2006.01)
- H01L 29/167 (2006.01)

(52) U.S. Cl. ............ 257/347; 257/348; 257/350; 257/351; 257/352; 257/353; 257/354; 257/507; 257/548; 257/610; 257/611; 257/612

(58) Field of Classification Search ........ 257/347–354, 257/548, 610–612, 507, 247
See application file for complete search history.

(56) References Cited

U.S. PATENT DOCUMENTS

| | | | | |
|---|---|---|---|---|
| 4,956,306 | A * | 9/1990 | Fuller et al. | 438/527 |
| 5,294,821 | A * | 3/1994 | Iwamatsu | 257/351 |
| 5,359,219 | A * | 10/1994 | Hwang | 257/351 |
| 5,751,041 | A * | 5/1998 | Suzuki et al. | 257/357 |
| 5,889,293 | A * | 3/1999 | Rutten et al. | 257/74 |
| 6,064,589 | A * | 5/2000 | Walker | 365/149 |
| 6,072,217 | A * | 6/2000 | Burr | 257/351 |
| 6,074,899 | A * | 6/2000 | Voldman | 438/155 |
| 6,100,567 | A * | 8/2000 | Burr | 257/365 |
| 6,215,155 | B1 * | 4/2001 | Wollesen | 257/351 |
| 6,303,414 | B1 * | 10/2001 | Ang et al. | 438/155 |
| 6,348,372 | B1 * | 2/2002 | Burr | 438/223 |
| 6,380,572 | B1 * | 4/2002 | Pain et al. | 257/292 |
| 6,391,695 | B1 * | 5/2002 | Yu | 438/166 |
| 6,391,752 | B1 * | 5/2002 | Colinge et al. | 438/585 |
| 6,437,405 | B2 * | 8/2002 | Kim | 257/347 |

(Continued)

FOREIGN PATENT DOCUMENTS

JP    2003-152192 A    5/2003

OTHER PUBLICATIONS

T. Ohtou et al., "Variable Body Effect Factor FD SOI MOSFET for Ultra-Low Power VTCMOS Applications", Extended Abstracts of the 2003 International Conference on Solid State Devices and Materials, 2003, pp. 272-273.

(Continued)

Primary Examiner—Ida M. Soward
(74) Attorney, Agent, or Firm—Foley & Lardner LLP

(57) ABSTRACT

A semiconductor device includes a support substrate, a buried insulation film, provided on the support substrate, having a thickness of 5 to 10 nm, a silicon layer provided on the buried insulation film, a MOSFET provided in the silicon layer, and a triple-well region provided in the support substrate under the MOSFET.

17 Claims, 6 Drawing Sheets

U.S. PATENT DOCUMENTS

| | | | |
|---|---|---|---|
| 6,566,713 B2 * | 5/2003 | Nii | 257/347 |
| 6,600,200 B1 * | 7/2003 | Lustig et al. | 257/371 |
| 6,762,477 B2 * | 7/2004 | Kunikiyo | 257/506 |
| 6,780,686 B2 * | 8/2004 | Wei et al. | 438/146 |
| 6,879,006 B2 * | 4/2005 | Sohn et al. | 257/376 |
| 6,919,236 B2 * | 7/2005 | Wei et al. | 438/149 |
| 6,927,146 B2 * | 8/2005 | Brask et al. | 438/458 |
| 6,930,357 B2 * | 8/2005 | Kang | 257/347 |
| 7,023,054 B2 * | 4/2006 | Ohsawa | 257/369 |
| 2002/0033511 A1 * | 3/2002 | Babcock et al. | 257/408 |
| 2002/0036290 A1 * | 3/2002 | Inaba et al. | 257/66 |
| 2002/0093064 A1 | 7/2002 | Inaba | |
| 2003/0032228 A1 * | 2/2003 | Honeycutt | 438/197 |
| 2003/0203546 A1 * | 10/2003 | Burbach et al. | 438/151 |
| 2003/0207504 A1 * | 11/2003 | Fuselier et al. | 438/151 |
| 2003/0207509 A1 * | 11/2003 | Kitamura | 438/199 |
| 2003/0209761 A1 * | 11/2003 | Yagishita et al. | 257/347 |
| 2004/0137667 A1 * | 7/2004 | Ogawa et al. | 438/142 |
| 2005/0082582 A1 * | 4/2005 | Rhodes | 257/291 |
| 2005/0205930 A1 * | 9/2005 | Williams | 257/347 |
| 2005/0230781 A1 * | 10/2005 | Ema et al. | 257/510 |

OTHER PUBLICATIONS

T. Yamada et al., An Embedded DRAM Technology on SOI/Bulk Hybrid Substrate Formed with SEG Process for High-End SOC Application, 2002 Symposium on VLSI Technology Digest of Technical Papers, 2002.

* cited by examiner

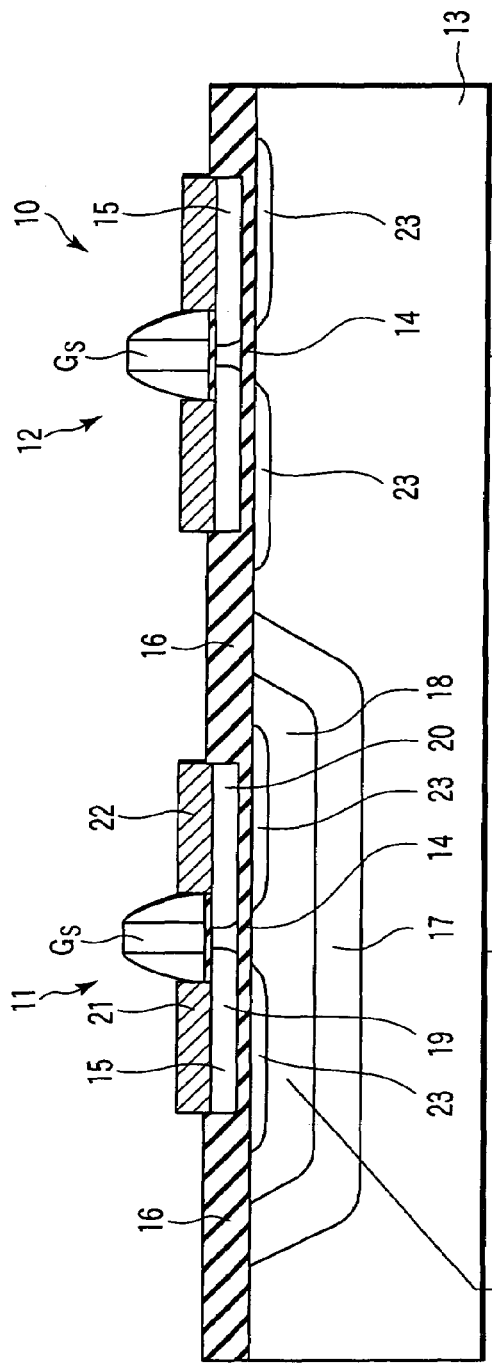
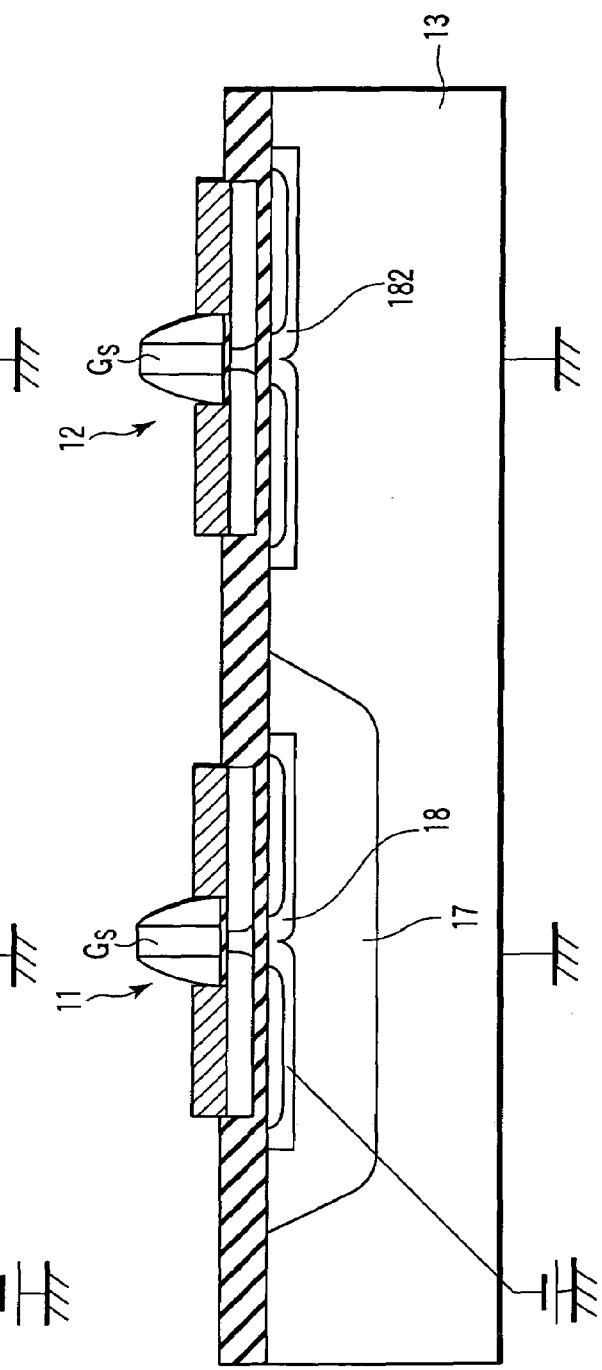
FIG. 1
FIG. 2

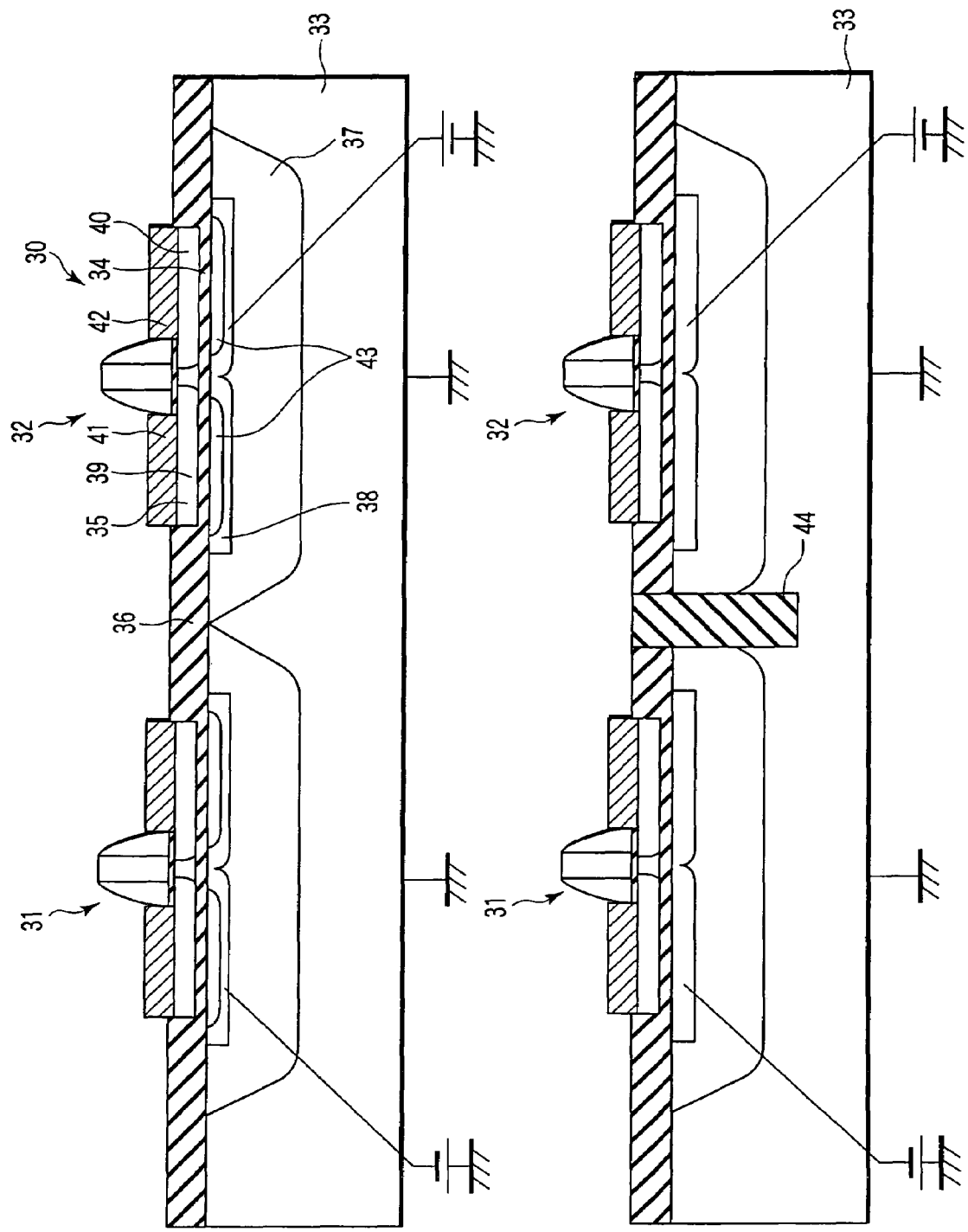

SEMICONDUCTOR DEVICE USING SOI STRUCTURE HAVING A TRIPLE-WELL REGION

CROSS-REFERENCE TO RELATED APPLICATIONS

This application is based upon and claims the benefit of priority from prior Japanese Patent Application No. 2004-229536, filed Aug. 5, 2004, the entire contents of which are incorporated herein by reference.

BACKGROUND OF THE INVENTION

1. Field of the Invention

The present invention relates generally to a semiconductor device, and more particularly to a device structure that achieves a high performance by fine patterning of a device region in a semiconductor integrated circuit using an SOI substrate.

2. Description of the Related Art

In recent years, as regards an LSI that is formed on a silicon substrate, a remarkable increase in performance is achieved by fine patterning of devices that are employed. This is because an improvement in performance of logic circuits or MOSFETs used in a memory device such as an SRAM is achieved by shrinkage in gate length or reduction in thickness of a gate insulation film according to so-called scaling rules. A further important point is that a short channel effect is suppressed by decreasing the junction depth in the source/drain regions.

To meet these requirements, there is an attempt to form a MOSFET on an SOI, thereby constituting an LSI. MOSFETs to be formed on the SOI fall into two kinds of devices: a partially depleted (PD) MOSFET and a fully depleted (FD) MOSFET. It is thought that in a future generation in which shallow junctions are required, the FD MOSFET that includes a thinner silicon layer will be more advantageous.

However, it is known that the FD-SOIMOSFET has the following drawbacks:

(1) The FD-SOIMOSFET is susceptible to a short channel effect, and reduction in thickness of the silicon layer is required in order to prevent such a short channel effect.

(2) The threshold cannot be freely controlled since the concentration in the substrate is such a low level that the channel is fully depleted.

(3) A parasitic resistance tends to increase.

As regards these drawbacks, a conventional FD-SOI-MOSFET, in principle, is able to control the threshold only by two factors: a work function of a gate electrode, and the thickness of a silicon layer (i.e. at which voltage a depletion layer completely extends and a fully depleted channel is formed).

There are proposed some methods for controlling the threshold, which include adoption of a double-gate structure wherein a thin channel region is vertically sandwiched between gate electrodes and equal potentials are applied to the channel region at a time to control the potential of the channel, and adoption of a back-gate structure wherein one-side voltage is fixed and used to adjust the threshold.

However, the above-mentioned structures, which have been reported so far, are very complicated and difficult to fabricate. There is a demand for a device architecture that is simple and easy to fabricate. In particular, in an LSI, it is not possible to provide a MOSFET that simply has a single threshold (Vt). It is necessary to realize multi-Vt (plural threshold voltages) within the circuit, but it is not easy to realize multi-Vt in a conventional structure if an LSI is to be constituted using an FD-SOI. A structure, where a support substrate is uniformly doped and a potential is applied, is disclosed in T. Ohtou et al.: Extended Abstract of International Conference on Solid State Devices and Materials (SSDM 2003), pp. 272-273 (2003). This structure, however, is unable to control the threshold of an arbitrary device, and is susceptible to latch-up.

It is also proposed in T. Yamada et al.: Symp. On VLSI Tech 2002, pp. 112-113 that after an SOI portion and a BOX film is partly removed and a silicon region is epitaxially grown on a support substrate, a MOSFET is formed on the silicon region to provide a device including an SOIMOSFET and a bulk MOSFET.

FIG. 10 is a cross-sectional view taken in a direction perpendicular to the channel direction of a prior-art FD-SOIMOSFET 90. For simple depiction, contacts and subsequently formed metal wiring layers are not shown. The MOSFET 90 comprises a support substrate 91, a silicon region 92 of a very thin film (~10 nm), a relatively thick buried insulation film (BOX film, ~150 nm) 93, and a gate electrode 94.

If a back-gate structure is to be realized, a substrate bias voltage is applied to the support substrate 91. However, since the BOX film 93 has a large thickness of 150 nm, a voltage of 10V or more needs to be applied in order to cause a sufficient voltage variation. Furthermore, since an equal voltage is applied to the entire support substrate, it is not possible to locally control the threshold.

In any case, as mentioned above, it is not easy to control the threshold in the conventional FD-SOI device, and it is difficult to provide a multi-Vt structure.

BRIEF SUMMARY OF THE INVENTION

According to a first aspect of the present invention, there is provided a semiconductor device comprising: a support substrate; a buried insulation film, on the support substrate, having a thickness of 5 to 10 nm; a silicon layer provided on the buried insulation film; a MOSFET provided in the silicon layer; and a triple-well region provided in the support substrate under the MOSFET.

According to a second aspect of the present invention, there is provided a semiconductor device comprising: a support substrate; a buried insulation film, provided on the support substrate, having a thickness of 5 to 10 nm; a first silicon layer provided on the buried insulation film; a second silicon layer provided on the support substrate as a bulk layer; a first MOSFET provided in the first silicon layer; a second MOSFET provided in the second silicon layer; and a triple-well region provided in the support substrate under at least each of the first and second MOSFETs.

According to a third aspect of the present invention, there is provided a semiconductor device comprising: a support substrate; a buried insulation film, provided on the support substrate, having a thickness of 5 to 10 nm; first and second silicon layers provided on the buried insulation film; an insulating isolation layer that is provided in the support substrate and insulation-isolates the first and second silicon layers; a fully depleted first MOSFET provided in the first silicon layer; a partially depleted second MOSFET provided in the second silicon layer; and a triple-well region provided in the support substrate under at least each of the first and second MOSFETs.

BRIEF DESCRIPTION OF THE SEVERAL VIEWS OF THE DRAWING

FIG. 1 is a cross-sectional view that schematically shows an SOI device according to a first embodiment;

FIG. 2 is a cross-sectional view that schematically shows a modification of the SOI device according to the first embodiment;

FIG. 3 is a cross-sectional view that schematically shows an SOI device according to a second embodiment;

FIG. 4 is a cross-sectional view that schematically shows a modification of the SOI device according to the second embodiment;

DETAILED DESCRIPTION OF THE INVENTION

Figures 5, 6:
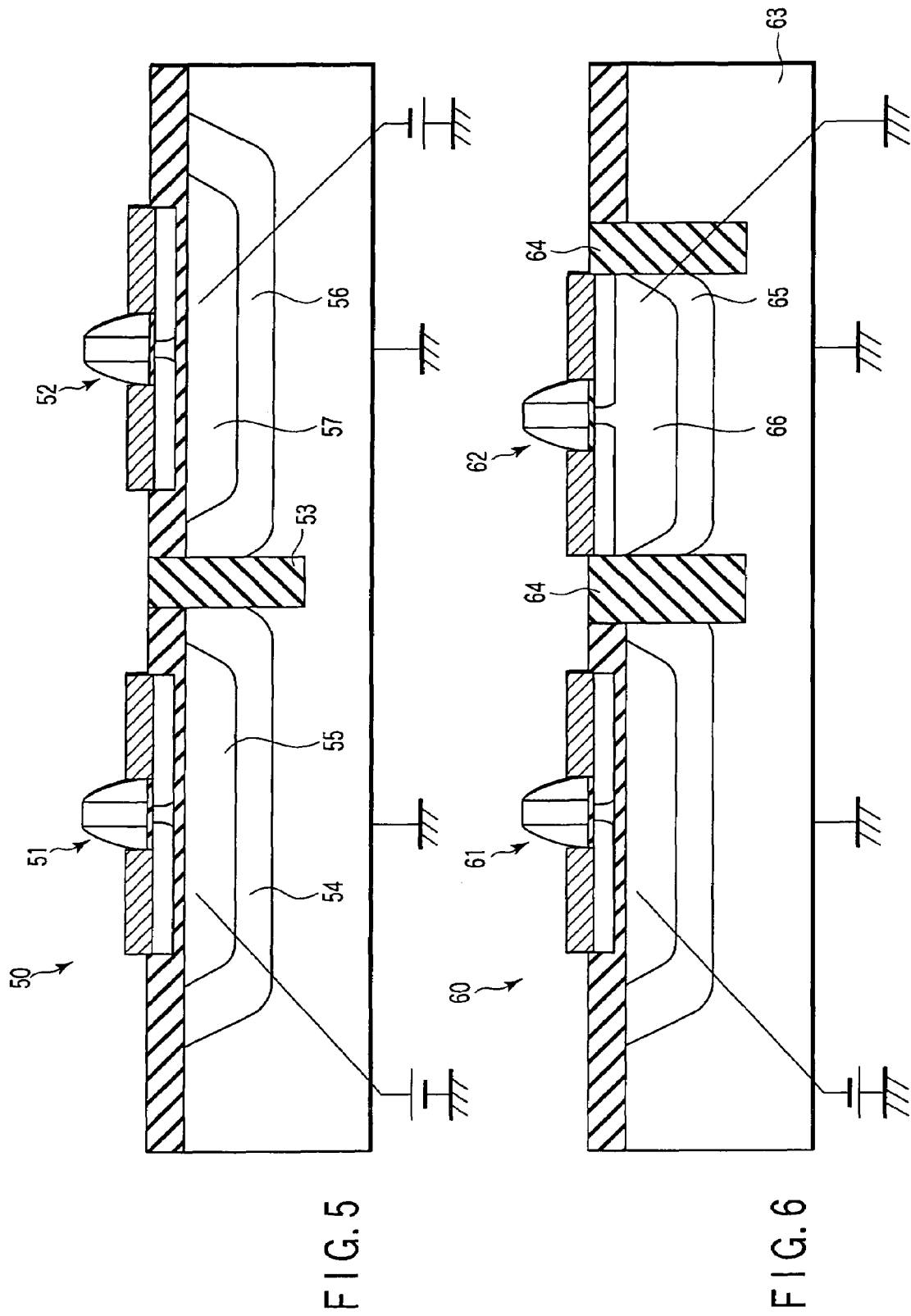
FIG. 5 is a cross-sectional view that schematically shows an SOI device according to a third embodiment.
FIG. 6 is a cross-sectional view that schematically shows a hybrid device according to a fourth embodiment.

FIG. 1 shows an SOI device 10 according to a first embodiment. The device 10 includes an n-channel MOSFET 11 with a controllable threshold and an n-channel MOSFET 12 with a fixed threshold.

The substrate for providing the SOI device 10 comprises a support substrate 13 formed of p-type silicon, a buried insulation film 14 that is formed on the support substrate 13 and has a thickness of 10 nm or less, preferably 5 to 10 nm, a p-type silicon layer 15 formed on the insulation film 14, and a shallow insulating isolation film 16 that isolates the MOSFETs 11 and 12.

In the support substrate 13 immediately below the MOSFET 11, a deep n-type well region 17 is formed. In addition, a shallow p-type well region 18 is formed in the deep n-type well region 17. As in usual cases, a gate structure Gs that comprises a gate insulation film, a gate electrode and a side-wall insulation film is provided on the p-type silicon layer 15. Further, n-type source and drain regions 19 and 20 each including an extension are formed by ion implantation so as to sandwich the gate structure Gs. On the source and drain regions 19 and 20, source and drain electrodes 21 and 22 are provided. By the ion implantation for forming the source and drain regions 19 and 20, n-type regions 23 are formed in the p-type well region 18 and in the support substrate 13, respectively.

With this structure, a positive potential is applied to the support substrate 13 and a negative potential is applied to the p-type well region 18, thus increasing the threshold of the MOSFET 11. As is described later, well contact regions are formed on regions other than the active regions of the MOSFETs.

The depth (thickness) and impurity concentration of the n-type well region 17 are set such that even if a sufficient voltage is applied to the p-type well region 18, no punch-through occurs between the p-type well region 18 and p-type support substrate 13 due to extension of depletion layers formed in these well regions. In addition, since the thin BOX film (Buried Oxide Film) 14 is used, even if part of impurities penetrates the BOX film and enters the support substrate 13 by the ion implantation for the source/drain formation, no problem arises with the electrical characteristics. In this case, the well regions are formed at proper parts in the support substrate by adjusting energy for the channel ion implantation that is performed before the gate of the MOSFET is formed.

Since the BOX film is very thin, a proper voltage, e.g. a voltage of 2.5V or less is applied. Thus, a breakdown voltage between the well regions, or resistance to latch-up, is improved. Moreover, the formation of the triple-well region makes it possible to locally control the substrate voltage.

FIG. 2 shows a modification of the SOI device 10 shown in FIG. 1. The parts common to those in FIG. 1 are denoted by like reference numerals. A shallow p-type well region 18 is formed by halo ion implantation immediately below the MOSFET 11. Similarly, a p-type well region 182 is formed by halo ion implantation immediately below the MOSFET 12.

Specifically, prior to the formation of the side-wall insulation film of the gate structure Gs, halo ions of $BF_2$ are implanted in the support substrate 13 using a resist mask in left and right oblique directions to the substrate (e.g. directions with inclinations of 60° to 30° to the substrate). Thereby, the p-type well regions 18 and 182 are formed in a self-alignment manner relative to the gate electrodes. As the impurity for the halo ion implantation, In (indium) is also usable.

Since the p-type well regions 18 and 182 are formed by the halo ion implantation, the impurity profile in the lateral direction is not uniform and the impurity is distributed symmetric with respect to the gate electrode. This also applies to the case of forming the n-type well regions by halo ion implantation.

In many cases, the extension of each of the source and drain regions is formed with the same structure if the operation power supply voltage is constant, even where the threshold is different. Taking this into account, the p-type well regions 18 and 182 are formed by the same halo ion implantation. In the meantime, the p-type well region 182 may not be formed.

Similarly with the case of the device formation in FIG. 1, contact regions for application of voltage are formed in the n-type well region and p-type well region, and the triple-well region is formed under such a condition that no punch-through occurs. With the present structure, the p-type well region 18, 182 is formed in a self-alignment manner relative to the gate electrode, and thus the above-described triple-well region can advantageously be applied to devices with relatively small design rules.

FIG. 3 shows an SOI device 30 according to a second embodiment. The SOI device 30 includes an n-channel MOSFET 31 and a p-channel MOSFET 32, which have controllable thresholds, and provides a CMOS structure. The MOSFET 31 has the same structure as the MOSFET 11 shown in FIG. 2, including the shallow p-type well region formed immediately below the MOSFET 31 by halo ion implantation. Thus, a description of the MOSFET 31 is omitted, and only the p-channel MOSFET 32 is described.

The substrate for providing the SOI device 30 comprises a support substrate 33 formed of p-type silicon, a buried insulation film 34 that is formed on the support substrate 33 and has a thickness of 10 nm or less, preferably 5 to 10 nm, an n-type silicon layer 35 formed on the insulation film 34, and a shallow insulating isolation film 36 that isolates the MOSFETs 31 and 32.

In the support substrate 33 immediately below the MOSFET 31, a deep p-type well region 37 is formed and a shallow n-type well region 38 is formed by halo ion implantation. In usual cases, As (arsenic) is used as an impurity for halo ion implantation, but Sb (antimony) may be used.

As in usual cases, a gate structure Gs that comprises a gate insulation film, a gate electrode and a side-wall insulation film is provided on the n-type silicon layer 35. Further, p-type source and drain regions 39 and 40 each including the extension are formed by ion implantation so as to sandwich the gate structure Gs. On the source and drain regions 39 and 40, source and drain electrodes 41 and 42 are provided. By the ion implantation for forming the source and drain regions 39 and 40, p-type regions 43 are formed in the n-type well region 38.

With this structure, a positive potential is applied to the support substrate 33 and a negative potential is applied to the p-type well region of the n-channel MOSFET 31, like the structure shown in FIG. 2, thereby increasing the absolute value of the threshold of the MOSFET 31. On the other hand, a positive potential is applied to the n-type well region 38 of the p-channel MOSFET 32, thereby increasing the absolute value of the threshold thereof.

In the above structure, at a glance, it appears that latch-up may occur. However, a reverse bias voltage is applied to the n-type well region and p-type well region immediately below the device, and the BOX film is a thin film with a thickness of 10 nm or less. Accordingly, the applied voltage can be set at +/−2V or less. Hence, if punch-through is sufficiently suppressed, no thyristor operation occurs.

Like the first embodiment, well contact regions are formed on regions other than the active regions of the MOSFETs, as will be described later.

FIG. 4 shows a modification of the SOI device 30 shown in FIG. 3. The parts common to those in FIG. 3 are denoted by like reference numerals, and a description of the n-channel MOSFET 31 and p-channel MOSFET 32 is omitted. Only characteristic parts are described.

As described above, unwanted latch-up does not occur in the SOI device 30. However, if consideration is given to possible occurrence of latch-up, a deep-trench isolation structure (trench well region isolation structure) 44 is formed in the support substrate 33, as shown in FIG. 4, and the n-channel MOSFET 31 and p-channel MOSFET 32 are isolated from each other.

The modification is not limited to the above structure. It is possible to form the triple-well region only in one of the n-channel MOSFET and p-channel MOSFET of the CMOS structure. In this case, deep-trench isolation is adopted, and MOSFETs with different well breakdown voltages are used in combination.

The above-described structure is also effective in a case where a metal gate is used and the threshold is proper to one of the MOSFETs but is high for the other MOSFET.

FIG. 5 shows an SOI device 50 according to a third embodiment. The SOI device 50 includes an n-channel MOSFET 51 and a p-channel MOSFET 52, which have controllable thresholds, to provide a CMOS structure. In this embodiment, the absolute value of the threshold of each MOSFET is set to be lower than a standard type device. The n-channel MOSFET 51, p-channel MOSFET 52 and trench isolation structure 53 for isolating these MOSFETs are the same as the n-channel MOSFET 31, p-channel MOSFET 32 and trench isolation structure 44, so a description thereof is omitted. Only characteristic parts are described.

Specifically, a deep p-type well region 54 and a shallow n-type well region 55, which is provided in the deep p-type well region 54, are formed immediately below the n-channel MOSFET 51. On the other hand, a deep n-type well region 56 and a shallow p-type well region 57, which is provided in the deep n-type well region 56, are formed immediately below the p-channel MOSFET 52.

In order to decrease the absolute value of the threshold of each of the MOSFETs 51 and 52, a positive potential is applied to the p-type support substrate, a positive potential is applied to the shallow n-type well region 55, and a negative potential is applied to the shallow p-type well region 57.

In this SOI device 50, if the applied voltage to the well region 55, 57 is increased, the same operation as with a so-called double-gate MOSFET is performed. Specifically, an inversion layer is formed at a BOX side interface of the SOI layer and can be made to operate as a channel. However, since the source/drain region overlaps the well region that functions as the gate electrode, a parasitic capacitance corresponding to the gate/drain capacitance (and gate/source capacitance) Cov increases. If a voltage (AC voltage), which is equal to an ordinary gate electrode voltage, is applied to render the device operative, only a very slow operation would be performed. Hence, in the case where the present device is incorporated in an ordinary high-speed circuit, it is advantageous to fix the potential that is applied to the well region 55, 57 on the support substrate side, without a variation in potential with time. It is advantageous to cause the device to operate as a double-gate MOSFET in a case where a current drive force is required even if the operation is slow.

In the first to third embodiments, it is assumed that the FD-SOIMOSFET is employed. The present invention, however, is applicable to a PD-SOI MOSFET or a bulk MOSFET that is formed on the SOI substrate. The bulk MOSFET is realized by partly removing the SOI region and the BOX film, epitaxially growing a silicon region on a support substrate, and forming a MOSFET in the silicon region.

Even in the case where the SOI MOSFET and the bulk MOSFET are formed in the support substrate, the threshold can be controlled by forming the triple-well region under the bulk MOSFET (in the region of the support substrate or the epitaxially grown region).

FIG. 6 shows a hybrid device 60 according to a fourth embodiment. The hybrid device 60 includes an SOI n-channel MOSFET 61 and a bulk n-channel MOSFET 62. The n-channel MOSFET 61 is the same as the n-channel MOSFET 11 shown in FIG. 1, so a description thereof is omitted. Only the well region structure of the bulk MOSFET 62 is described.

The bulk MOSFET 62 is formed in the epitaxially grown silicon region on the support substrate 63 and is surrounded by a trench isolation structure 64. Immediately below the n-channel MOSFET 62, a deep n-type well region 65 is formed. In addition, a shallow n-type well region 66 is formed in the deep n-type well region 65.

Specifically, a triple-well region is formed in the support substrate 63 immediately below the bulk MOSFET 62 so that the threshold thereof may be controllable. In this case, a voltage, which is equal to the voltage to the support substrate, is applied to the bulk MOSFET 62. Of course, a different potential may be applied.

Figure 7:
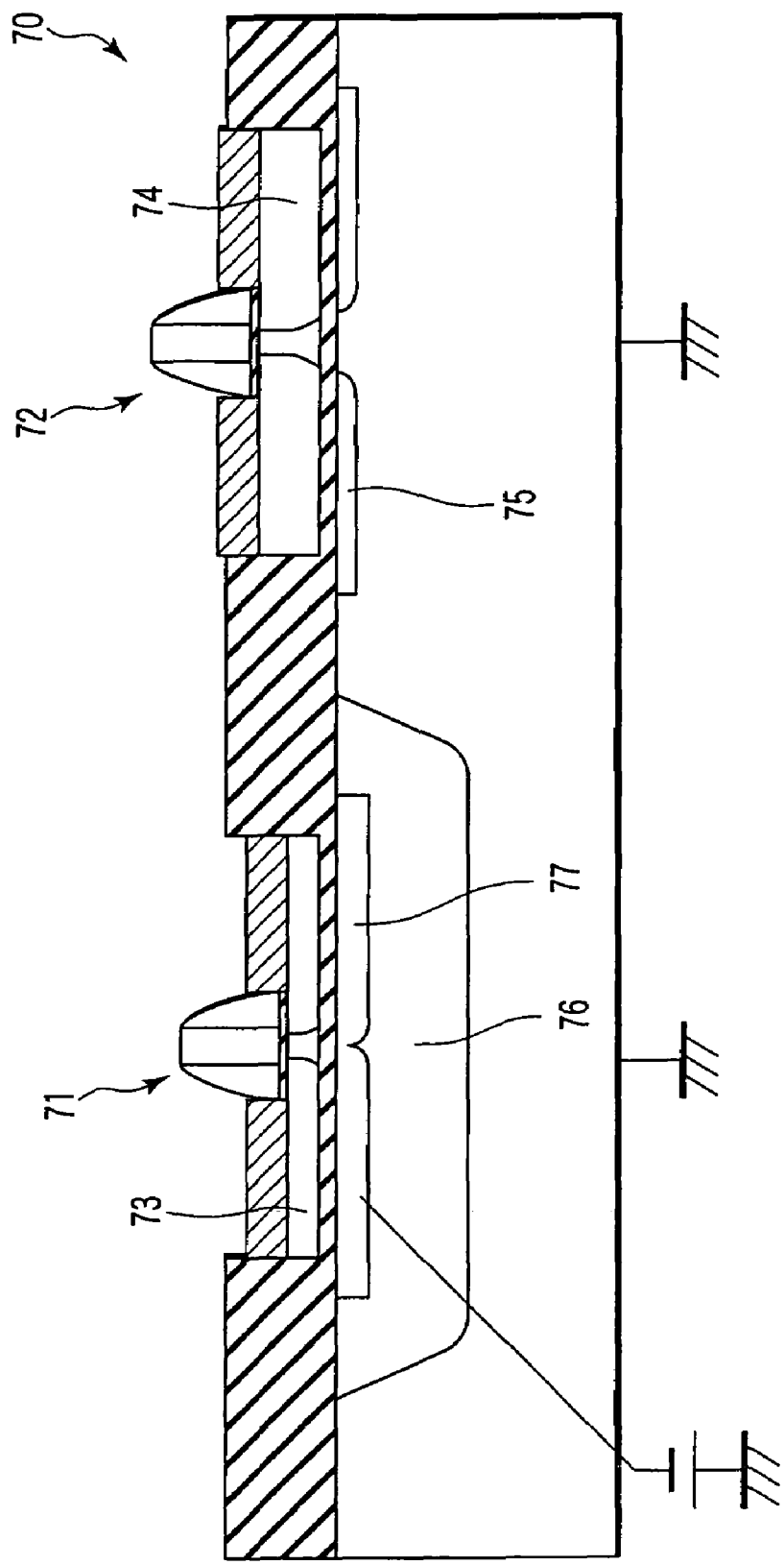
FIG. 7 is a cross-sectional view that schematically shows a hybrid device according to a fifth embodiment, where an FD-SOIMOSFET and a PD-SOIMOSFET are provided.

FIG. 7 shows a device 70 according to a fifth embodiment, which includes an FD-SOIMOSFET and a PD-SOIMOS- FET. In general, the FD-SOIMOSFET and PD-SOIMOSFET operate differently because the thicknesses of their silicon parts are different. Thus, the thickness of a silicon layer 74 of the PD-SOIMOSFET 72 is made greater than the thickness of a silicon layer 73 of the FD-SOIMOSFET 71.

There are optimal silicon film thicknesses for respective operation modes. A desired silicon film thickness can be obtained by performing a combination of an oxidizing step and an etching step after the respective regions are masked.

In the case of only the FD-MOSFET 71 or in the case of only the PD-MOSFET 72, the threshold can be controlled by forming the triple-well region. In this case, there is a tendency that the depth of a p-type well region 75 formed in the PD-MOSFET 72 becomes less than the depth of a p-type well region 77 formed in an n-type well region 76 in the support substrate since the thickness of the silicon layer 74 is greater than the silicon layer 73 of the FD-MOSFET 71. The application of potential to the p-type well region 77 is the same as in the device shown in FIG. 1, etc.

As regards the manufacturing method, the present device can be formed similarly with an ordinary FD-SOI device. Only a fabrication step of performing channel or well ion implantation in the region, where the threshold is to be controlled, is added.

Figure 8:
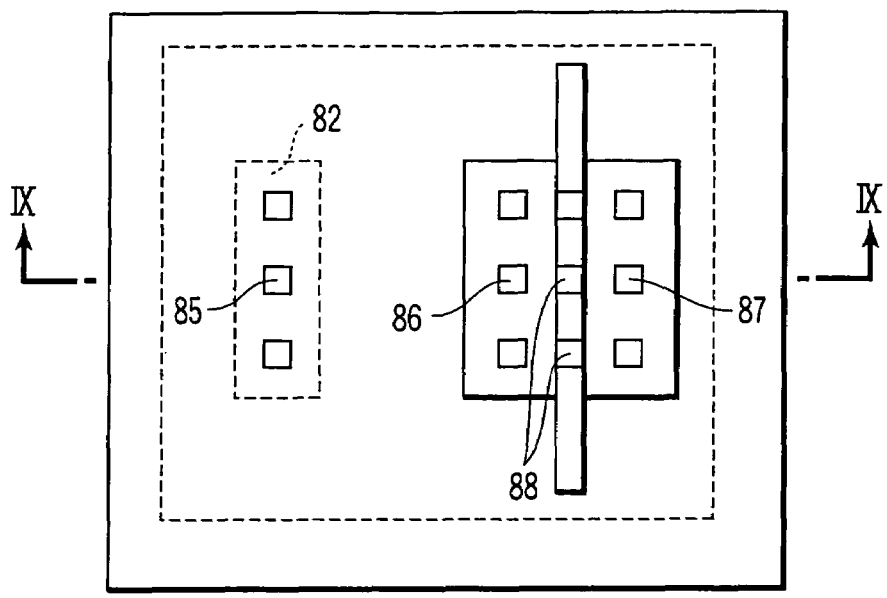
FIG. 8 is a plan view that schematically shows an structure where a well contact region is formed on a region other than an active region of the MOSFET.
Figure 9:
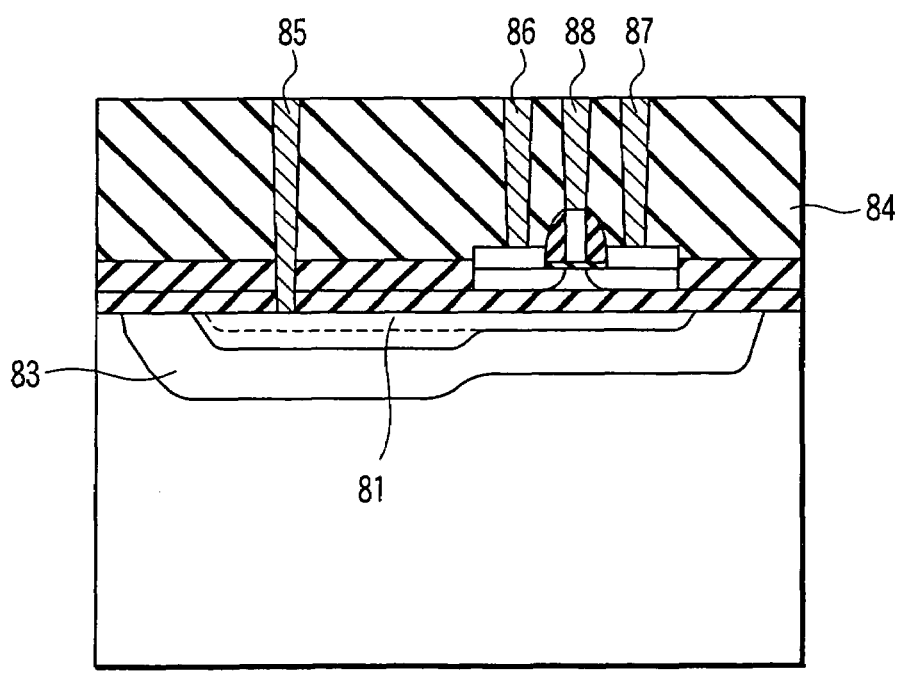
FIG. 9 is a cross-sectional view that schematically shows the structure where the well contact region is formed on the region other than the active region of the MOSFET.
Figure 10:
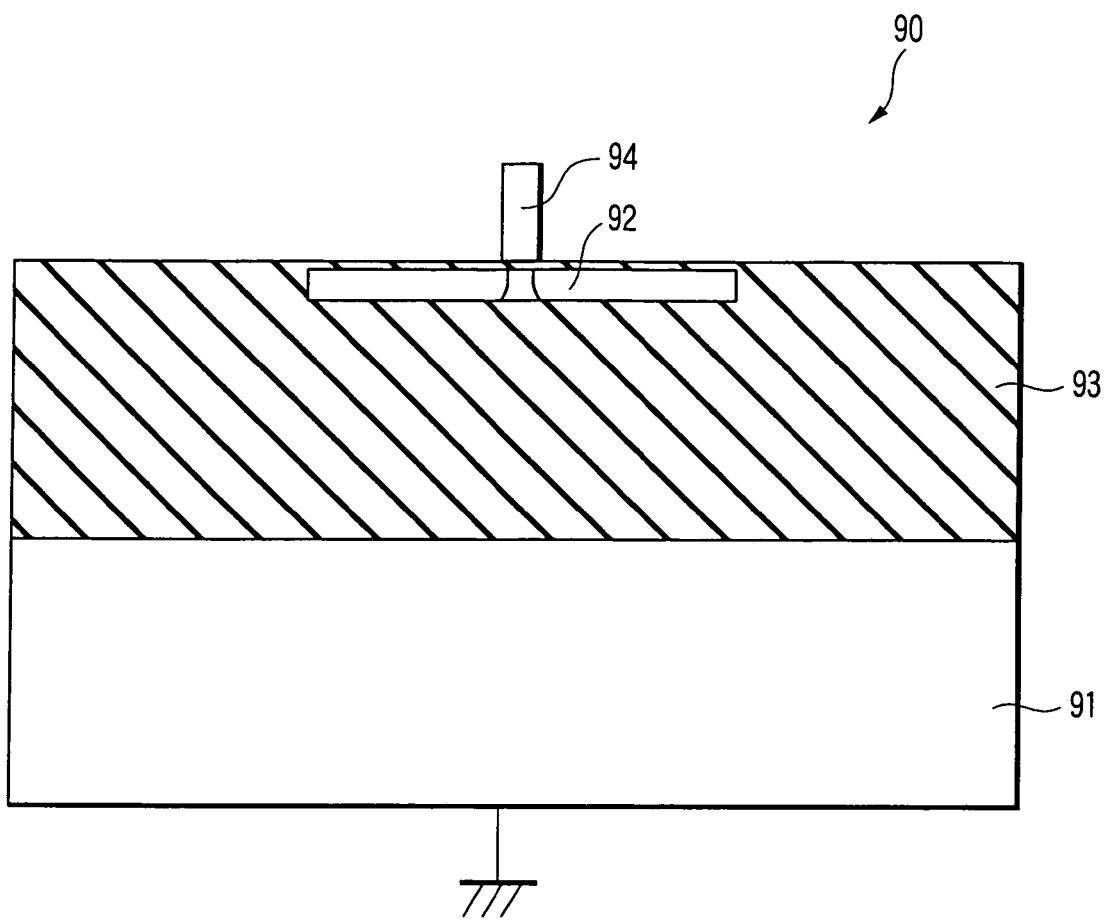
FIG. 10 is a schematic cross-sectional view taken in a direction perpendicular to the channel direction of a prior-art FD-SOIMOSFET 90.

FIGS. 8 and 9 schematically show a structure where a well contact region is formed on a region other than an active region of the MOSFET. This structure is applied to the n-channel MOSFETs shown in FIGS. 2 to 4, and only characteristic parts are described. Specifically, FIGS. 8 and 9 show a state in which contacts are provided on the p-type well region formed by halo ion implantation, the source/drain regions and the gate structure. As regards these Figures, FIG. 9 is a cross-sectional view taken along line IX-IX in the plan view of FIG. 8.

In order to suppress an increase in contact resistance, $p^+$ ions are implanted over a region 82 on the p-type well region 81, where contacts are to be made. By the ion implantation, parts of the p-type well region 81 and n-type well region 83 are pushed down in the depth direction.

Thereafter, an interlayer insulation film 84 is formed on the substrate surface, following which contact holes are formed in the interlayer insulation film 84 so as to reach the p-type well region, the source/drain electrodes and the gate. Conductors are buried in the contact holes, thus forming contacts 85 for the p-type well region, contacts 86 and 87 for the source/drain electrodes, and contacts 88 for the gate. For good contact, three contacts are provided for each of the p-type well region, source/drain regions, and gate, as shown in FIG. 8.

As is clear from the above-described embodiments, the triple-well region is formed in the support substrate, and a potential can be applied thereto. It is thus possible to locally control the threshold by varying the channel potential (body potential) of the SOIMOSFET. Further, the use of the thin BOX film makes it easy to obtain the above-described structure. As a result, the aforementioned drawbacks can be overcome, and it becomes possible to provide a device structure and a method of manufacturing the same, which can relatively easily achieve a control of the threshold voltage for the device in the SOI part and an improvement in short channel effect.

The modifications of the embodiments will be given by:

(1) The absolute value of the threshold of the MOSFET having at least one triple-well region, to which a potential is locally applied, is higher than in the MOSFET to which no substrate potential is applied.

(2) The absolute value of the threshold of the MOSFET having at least one triple-well region, to which a potential is locally applied, is lower than in the MOSFET to which no substrate potential is applied.

(3) The p-well region and the n-well region are successively formed from a position near the channel part within the support substrate region under at least one n-MOSFET region, and the impurity concentration in the p-well region has a non-uniform profile in the lateral direction.

(4) The n-well region and the p-well region are successively formed from a position near a channel part within the support substrate region under at least one p-MOSFET region, and the impurity concentration in the n-well region has a non-uniform profile in the lateral direction.

(5) A potential, which is to be applied to a part of the triple-well region formed in the support substrate, is applied under such a condition that a depletion layer produced by a pn junction formed in the triple-well region becomes narrower than an outside well region.

(6) A region, which is doped with the impurity of the same conductivity type as the impurity for forming source/drain regions, is present in the n-well region that is formed immediately below a channel part within the support substrate region under at least one p-MOSFET region.

(7) The CMOS structure is provided, which comprises a combination of the n-MOSFET that includes at least one triple-well region in the support substrate, and the p-MOSFET that includes at least one triple-well region in the support substrate.

(8) A potential, which is different from a potential applied to the triple-well region of the MOSFET in the SOI part, is applied to the triple-well region of the bulk MOSFET.

(9) A potential, which is different from a potential applied to the triple-well region of the fully depleted MOSFET, is applied to the triple-well region of the partially depleted MOSFET.

(10) An inner shallow well region of the triple-well region is formed in a self-alignment manner relative to the gate electrode by the same ion implantation as for the halo part at a time of forming source/drain regions of the MOSFET.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
a support substrate;
a buried insulation film, provided on the support substrate, having a thickness of 5 to 10 nm;
a silicon layer provided on the buried insulation film;
a MOSFET provided in the silicon layer, having a channel region;
a triple-well region comprised of a first well region provided in the support substrate and a second well region formed in the first well region, the second well region overlapping an entire region of the channel region;
another silicon layer provided on the buried insulation film;
another MOSFET provided in said another silicon layer; and
another triple-well region that is provided in the support substrate under said another MOSFET.

2. The semiconductor device according to claim 1, wherein one well region in the triple-well region has a well contact region for application of a well bias voltage.

3. The semiconductor device according to claim 1, wherein a potential voltage applied to a part of the triple-well region formed in the support substrate is set under such a condition that the potential voltage is lower than a voltage that causes latch-up.

4. The semiconductor device according to claim 1, wherein said another MOSFET is a p-channel MOSFET.

5. The semiconductor device according to claim 1, wherein one well region in said another triple-well region has a well contact region for application of a well bias voltage.

6. The semiconductor device according to claim 1, wherein a potential voltage, which is to be applied to a part of said another triple-well region formed in the support substrate, is applied under such a condition that a reverse bias voltage is always applied to a pn junction formed by said another triple-well region.

7. The semiconductor device according to claim 1, wherein said another silicon layer is insulation-isolated from the silicon layer by a shallow insulating isolation film provided on the buried insulation film.

8. The semiconductor device according to claim 1, wherein the second well region has a same conductivity as that of the channel region of the MOSFET.

9. The semiconductor device according to claim 1, wherein a potential voltage, which is to be applied to a part of the triple-well region formed in the support substrate, is applied under such a condition that a reverse bias voltage is always applied to a pn junction formed by the triple-well region.

10. The semiconductor device according to claim 9, wherein the second well region has a same conductivity as that of the channel region of the MOSFET and the potential voltage is applied to the second well region.

11. A semiconductor device, comprising:
a support substrate;
a buried insulation film, provided on the support substrate, having a thickness of 5 to 10 nm;
a silicon layer provided on the buried insulation film;
a MOSFET provided in the silicon layer, having a channel region;
a triple-well region comprised of a first well region provided in the support substrate and a second well region formed in the first well region, the second well region overlapping an entire region of the channel region;
another silicon layer provided on the buried insulation film; and
another MOSFET provided in said another silicon layer, wherein the MOSFET is an n-channel MOSFET, and
wherein a region, which is doped with an impurity of the same conductivity type as the impurity for forming source/drain regions, is present in a p-well region formed immediately below a channel within the support substrate under the n-MOSFET region.

12. A semiconductor device, comprising:
a support substrate;
a buried insulation film, provided on the support substrate, having a thickness of 5 to 10 nm;
a silicon layer provided on the buried insulation film;
a MOSFET provided in the silicon layer, having a channel region;
a triple-well region comprised of a first well region provided in the support substrate and a second well region formed in the first well region, the second well region overlapping an entire region of the channel region;
another silicon layer provided on the buried insulation film; and
another MOSFET provided in said another silicon layer, wherein said another silicon layer is insulation-isolated from the silicon layer by an insulating isolation film provided in the support substrate.

13. A semiconductor device comprising:
a support substrate;
a buried insulation film, provided on the support substrate, having a thickness of 5 to 10 nm;
a first silicon layer provided on the buried insulation film;
a second silicon layer provided on the support substrate as a bulk layer;
a first MOSFET provided in the first silicon layer;
a second MOSFET provided in the second silicon layer; and
a triple-well region provided in the support substrate under at least each of the first and second MOSFETs.

14. The semiconductor device according to claim 13, wherein one well region in the triple-well region has a well contact region for application of a well bias voltage.

15. The semiconductor device according to claim 13, further comprising an isolation region formed by a trench between the triple-well regions.

16. A semiconductor device comprising:
a support substrate;
a buried insulation film, provided on the support substrate, having a thickness of 5 to 10 nm;
first and second silicon layers provided on the buried insulation film;
an insulating isolation layer that is provided in the support substrate and insulation-isolates the first and second silicon layers;
a fully depleted first MOSFET provided in the first silicon layer;
a partially depleted second MOSFET provided in the second silicon layer; and
a triple-well region provided in the support substrate under at least each of the first and second MOSFETs.

17. The semiconductor device according to claim 16, wherein one well region in the triple-well region has a well contact region for application of a well bias voltage.

* * * * *